US010930842B2

(12) United States Patent
Pandey

(10) Patent No.: US 10,930,842 B2
(45) Date of Patent: Feb. 23, 2021

(54) MULTIFERROIC MAGNETIC TUNNEL JUNCTION DEVICES

(71) Applicant: Micron Technology, Inc., Boise, ID (US)

(72) Inventor: Sumeet C. Pandey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/414,537

(22) Filed: May 16, 2019

(65) Prior Publication Data

US 2019/0280192 A1  Sep. 12, 2019

Related U.S. Application Data

(62) Division of application No. 15/364,153, filed on Nov. 29, 2016, now Pat. No. 10,319,903.

(51) Int. Cl.
| | |
|---|---|
| *H01L 43/10* | (2006.01) |
| *H01L 43/08* | (2006.01) |
| *H01L 27/22* | (2006.01) |
| *H01L 27/20* | (2006.01) |

(52) U.S. Cl.
CPC ............. *H01L 43/10* (2013.01); *H01L 27/20* (2013.01); *H01L 27/22* (2013.01); *H01L 27/222* (2013.01); *H01L 43/08* (2013.01)

(58) Field of Classification Search
CPC ....... H01L 27/20; H01L 27/22; H01L 27/222; H01L 41/00; H01L 43/08
See application file for complete search history.

(56) References Cited

U.S. PATENT DOCUMENTS

| | | | |
|---|---|---|---|
| 9,047,950 B2 | 6/2015 | Amiri et al. | |
| 9,355,699 B2 | 5/2016 | Khalili Amiri et al. | |
| 9,577,184 B2 | 2/2017 | Zhao et al. | |
| 10,319,903 B2* | 6/2019 | Pandey | |
| 2008/0267809 A1* | 10/2008 | Aimone | C22B 9/22 420/427 |
| 2009/0190264 A1* | 7/2009 | Fukuzawa | G11C 11/16 360/246.4 |
| 2010/0102369 A1 | 4/2010 | Tian et al. | |
| 2012/0069648 A1 | 3/2012 | Kramer et al. | |

(Continued)

OTHER PUBLICATIONS

Chau, "Intel Discusses Future Research Options at IEDM 2015", Technology @ Intel, Dec. 9, 2015, 3 pages.

(Continued)

*Primary Examiner* — Phat X Cao
(74) *Attorney, Agent, or Firm* — Wells St. John P.S.

(57) ABSTRACT

Some embodiments include a magnetic tunnel junction device having a first magnetic electrode, a second magnetic electrode, and a tunnel insulator material between the first and second magnetic electrodes. A tungsten-containing material is directly against one of the magnetic electrodes. In some embodiments the tungsten-containing material may be in a first crystalline lattice arrangement, and the directly adjacent magnetic electrode may be in a second crystalline lattice arrangement different from said first crystalline lattice arrangement. In some embodiments the tungsten-containing material, the first magnetic electrode, the tunnel insulator material and the second magnetic electrode all comprise a common crystalline lattice arrangement.

17 Claims, 4 Drawing Sheets

(56) References Cited

U.S. PATENT DOCUMENTS

| | | |
|---|---|---|
| 2014/0319634 A1 | 10/2014 | Shukh |
| 2015/0008549 A1* | 1/2015 | Lee .................. H01L 43/10 |
| | | 257/421 |
| 2016/0064654 A1* | 3/2016 | Tonegawa ............ H01L 27/228 |
| | | 257/421 |
| 2017/0110651 A1 | 4/2017 | Park et al. |
| 2017/0263853 A1 | 9/2017 | Manipatruni et al. |

OTHER PUBLICATIONS

Manners, "Moscow Researchers Explain Very Strong Magnoetoelectric Effect in Bismuth Ferrite", downloaded from http://www.electronicsweekly.com/news/research-news/moscow-researchers-explain-very-strong-magnetoelectric-effect-in-bismtith-errite-2016-05/ on Sep. 20, 2016, 3 pgs.

Scott, "Room-Temperature Multiferroic Magnetoeiectrics", NPG Asia Materials, Nature Publishing Group, Cambridge University, e72, 2013, United Kingdom, pp. 1-11.

Thomas, "New Samsung Open Innovation Program for STT-MRAM Technology—An Interview With Alexander Driskill-Smith", Insights from Industry, Interview conducted by G.P. Thomas, Sep. 17, 2013, 8 pages.

Vermeulen et al., "The Giant VCMA Effect for Novel MRAM Applications", General Scientific Meeting 2016 of the Belgian Physical Society, Poster Session, 1 page.

\* cited by examiner

MULTIFERROIC MAGNETIC TUNNEL JUNCTION DEVICES

RELATED PATENT DATA

This patent resulted from a divisional of U.S. patent application Ser. No. 15/364,153 which was filed Nov. 29, 2016 and which is hereby incorporated by reference.

TECHNICAL FIELD

Multiferroic magnetic tunnel junction devices, and magnetoelectric devices.

BACKGROUND

A magnetic tunnel junction (MTJ) device is an integrated circuit component having two conductive magnetic electrodes separated by a thin non-magnetic tunnel insulator material (e.g., dielectric material). The insulator material is sufficiently thin such that electrons can tunnel from one magnetic electrode to the other through the insulator material under appropriate conditions. At least one of the magnetic electrodes can have its overall magnetization direction switched between two states at a normal operating write or erase current/voltage, and is commonly referred to as the "free" or "recording" magnetic electrode. The other magnetic electrode is commonly referred to as the "reference", "fixed", or "pinned" magnetic electrode, and has an overall magnetization direction which is not switched upon application of the normal operating write or erase current/voltage.

The free magnetic electrode and the fixed magnetic electrode are electrically coupled to respective conductive nodes. Electrical resistance between those two nodes through the free magnetic electrode, insulator material, and the fixed magnetic electrode is dependent upon the magnetization direction of the free magnetic electrode relative to that of the fixed magnetic electrode. Accordingly, a magnetic tunnel junction can be programmed into one of at least two states, and those states can be sensed by measuring current flow through the magnetic tunnel junction device. Other methods of reading may include a so-called "switch and detect" scheme.

Since magnetic tunnel junction devices can be "programmed" between two current-conducting states, they have been proposed for use in memory integrated circuitry. Additionally, magnetic tunnel junction devices may be used in logic, sensors, oscillators or other circuitry apart from or in addition to memory.

DETAILED DESCRIPTION OF THE ILLUSTRATED EMBODIMENTS

A problem with conventional MTJ devices is that such are "current-driven" meaning that they are controlled by an amount of current passing through the devices. The current-driven devices tend to require high power and high-drive-current select devices, and are difficult to scale in three dimensions. Accordingly, it is desired to develop improved MTJ devices. Ideally, such devices would be "voltage-controlled" or "voltage-assisted". Both voltage-controlled MTJ devices and voltage-assisted MTJ devices are operated by electric fields across the devices; with the difference between the devices being that voltage-controlled MTJ devices have effectively no leakage current passing through the devices, whereas voltage-assisted MTJ devices may have some current leakage across the devices. Accordingly, voltage-assisted MTJ devices may be operated in conjunction with select devices (for instance, ovonic threshold switching devices, C-diodes, other diodes, etc.) whereas voltage-controlled MTJ devices may be operated without select devices. Advantages of voltage-controlled MTJ devices and voltage-assisted MTJ devices are that such may be operated at lower power as compared with current-driven MTJ devices, may be utilized with lower-drive-current select devices as compared with current-driven MTJ devices (or, in some cases, may be operated without select devices), and may be more effectively scaled into highly-integrated arrays than current-driven MTJ devices, etc.

Some embodiments utilize lattice strain to alter characteristics of MTJ devices (specifically, to utilize magnetoelastic effects to enhance the changes in magnetic anisotropy), and thereby form voltage-controlled or voltage-assisted MTJ devices. Some embodiments may additionally utilize piezoelectric compositions within the tunnel insulator material to induce multiferroic behavior within the MTJ devices. Such may enable the effective dielectric constant of the tunnel insulator material within the MTJ devices to become electric field dependent, which can further enhance voltage-controlled or voltage-assisted behavior of the MTJ devices. Example embodiments are described with reference to FIGS. 1-6.

Figure 1:
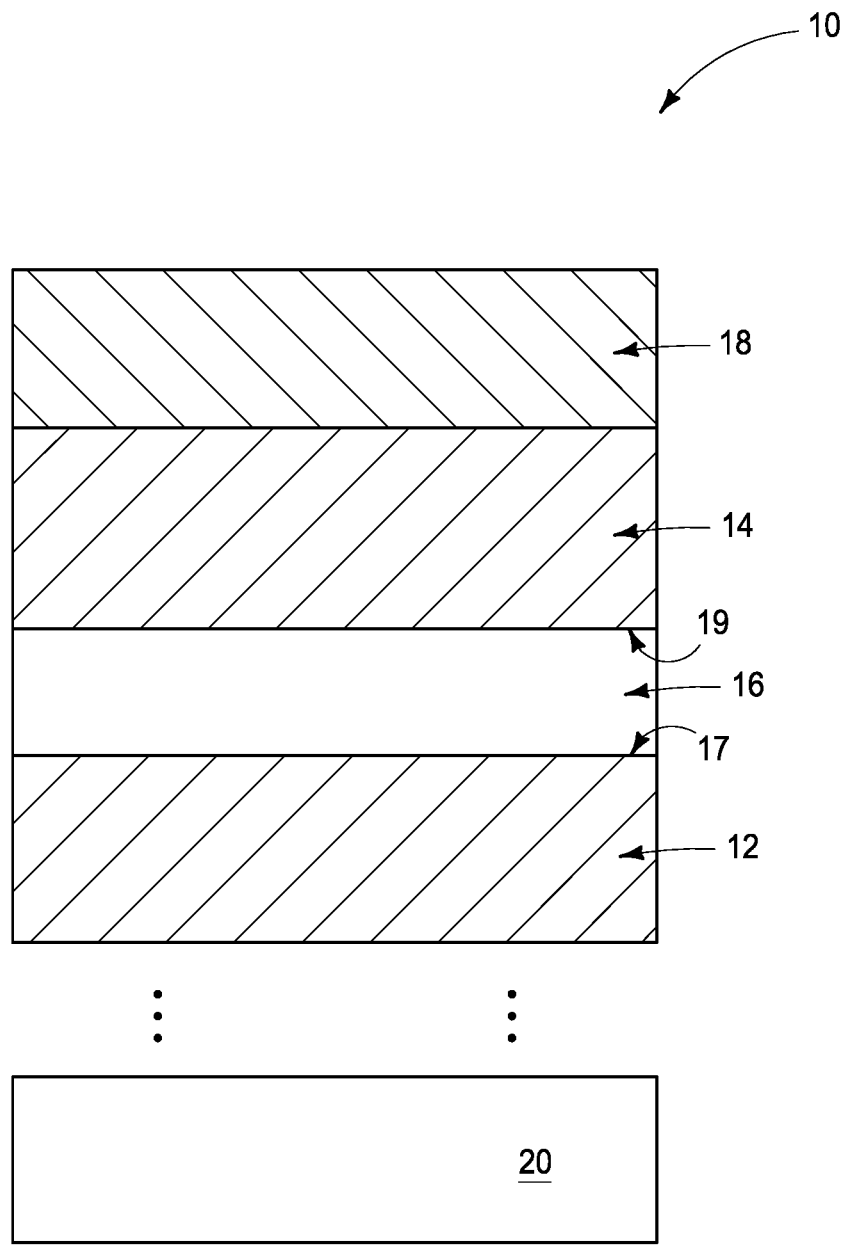
FIGS. 1-6 are diagrammatic cross-sectional views of example embodiment MTJ devices.

Referring to FIG. 1, an example MTJ device 10 includes a first magnetic electrode 12, a second magnetic electrode 14, and tunnel insulator material 16 between the first and second magnetic electrodes (12/14). One of the magnetic electrodes (12/14) is a fixed magnetic electrode and the other is a free magnetic electrode. For instance, in some embodiments the illustrated lower electrode 12 may be the free magnetic electrode, and the upper electrode 14 may be the fixed magnetic electrode.

The magnetic electrodes 12/14 may comprise any suitable compositions or combinations of compositions. For instance, the magnetic electrodes 12/14 may comprise alloys or other mixtures of Co and Fe; and in some applications may further comprise boron. In some example embodiments, the magnetic electrodes 12/14 may comprise the composition $Co_xFe_yB_z$ where x and y are each 10-80 and z is 0-50. Such composition may be referred to as CoFe or CoFeB. The magnetic electrodes 12/14 may comprise a same composition as one another, or may comprise different compositions relative to another. The magnetic electrodes 12/14 are individually overall and collectively magnetic, even though one or both may have one or more regions therein which are intrinsically nonmagnetic.

The tunnel insulator material 16 may comprise any suitable composition or combination of compositions, and may or may not comprise piezoelectric material. Some example compositions include Mg and O; and various example compositions are described in more detail with reference to specific embodiments below.

The magnetic electrodes 12/14 and tunnel insulator material 16 are shown to be homogeneous, but in other embodiments may be nonhomogeneous.

A tungsten-containing material 18 is directly against the magnetic electrode 14. The tungsten-containing material 18 may comprise, consist essentially of, or consist of tungsten. In some embodiments, the tungsten-containing material 18 may comprise other elements in addition to tungsten. For instance, in some embodiments the tungsten-containing material 18 may comprise one or both of iridium and ruthenium in addition to the tungsten.

The tungsten-containing material 18 is in a first crystalline lattice arrangement, and the magnetic electrode 14 is in a second crystalline lattice arrangement different from the first crystalline lattice arrangement. Accordingly, the tungsten-containing material 18 imparts lattice strain to the magnetic electrode 14. In some embodiments, such lattice strain may be a compressive strain. The strain may extend through the magnetic electrode 14 and into the tunnel insulator material 16, and may even extend through the tunnel insulator material 16 and into the lower magnetic electrode 12. The tunnel insulator material 16 has interfaces 17 and 19 where the tunnel insulator material is directly against the magnetic electrodes 12 and 14, respectively. The lattice strain imparted into the tunnel insulator material 16 may create a magneto-elastic effect along the interfaces 17 and 19; with the effect being strongest along the interface 19 which is closest to the strain-inducing tungsten-containing material 18, in some embodiments.

The magneto-elastic effect leads to magnetic anisotropy, and specifically may provide an anisotropic component which modulates with an electric field across the MTJ device 10, to thereby enable magnetic characteristics of the MTJ device to be altered with the voltage across the MTJ device. Accordingly, the MTJ device 10 may be a voltage-controlled device (if no leakage current passes through the device) or may be a voltage-assisted device (if some leakage current passes through the device).

The strain-inducing tungsten-containing material 18 and the magnetic electrode 14 may have crystalline lattice arrangements which are both within a common crystal system as one another. For instance, both may have crystalline lattice arrangements which are within cubic crystal systems, both may have crystalline lattice arrangements which are within hexagonal crystal systems, etc. For instance, in some embodiments the tungsten-containing material 18 and the magnetic electrode 14 may have first and second crystalline lattice arrangements, respectively, with both crystalline lattice arrangements being within the cubic crystal system; and with one of the crystalline lattice arrangements having a body-centered-cubic (bcc) unit cell, and the other having a face-centered-cubic (fcc) unit cell.

In some embodiments, voltage control of the MTJ device 10 may be enhanced by utilizing a piezoelectric composition within the tunnel insulator material 16. The piezoelectric composition may comprise any suitable substances. For instance, in some embodiments the piezoelectric composition may include zirconium and oxygen. In some embodiments, the piezoelectric composition may further include one or more of Ba, Bi, Be, Ca, Mg, Hf, Al, S, Sr, Ti and Cr in addition to the zirconium and oxygen. Inclusion of antiferroelectric materials and/or ferroelectric materials may enhance the magnetoelectric effect.

The piezoelectric composition may advantageously have multiferroic properties which enable properties of the tunnel insulator material 16 to be altered with changes in an electric field. For instance, in some embodiments such multiferroic properties may enable the effective dielectric constant of the tunnel insulator material 16 to be varied with changes in an electric field. Accordingly, the composition, thickness, or other physical properties of a piezoelectric composition within the tunnel insulator material 16 may be tailored for particular applications, with such physical properties of the piezoelectric material altering voltage-dependent characteristics of the MTJ device 10 and thereby tailoring such voltage-dependent characteristics for the particular applications.

The piezoelectric composition may be a homogeneous composition, or may be a laminate of multiple different compositions. Further, in some embodiments the tunnel insulator material 16 may comprise a laminate of non-piezoelectric compositions and piezoelectric compositions.

The MTJ device 10 is supported by a base 20. The base 20 may comprise semiconductor material; and may, for example, comprise, consist essentially of, or consist of monocrystalline silicon. The base 20 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base 12 may correspond to a semiconductor substrate containing one or more materials associated with integrated circuit fabrication. Such materials may include, for example, one or more of refractory metal materials, barrier materials, diffusion materials, insulator materials, etc. A gap is provided between base 20 and MTJ device 10 to indicate that there may be additional materials and/or structures provided between the base 20 and the MTJ device 10 in some embodiments. In other embodiments the MTJ device 10 may be directly against the base 20.

The embodiment of FIG. 1 utilizes tungsten-containing capping material 18 to induce strain within underlying magnetic electrodes 12/14 and tunnel insulator material 16 of an MTJ device 10. In other embodiments, a tungsten-containing material may be provided as a seed which induces a strained lattice within materials of the MTJ device formed over such seed, with an example of such other embodiments being described with reference to FIG. 2.

Figure 2:
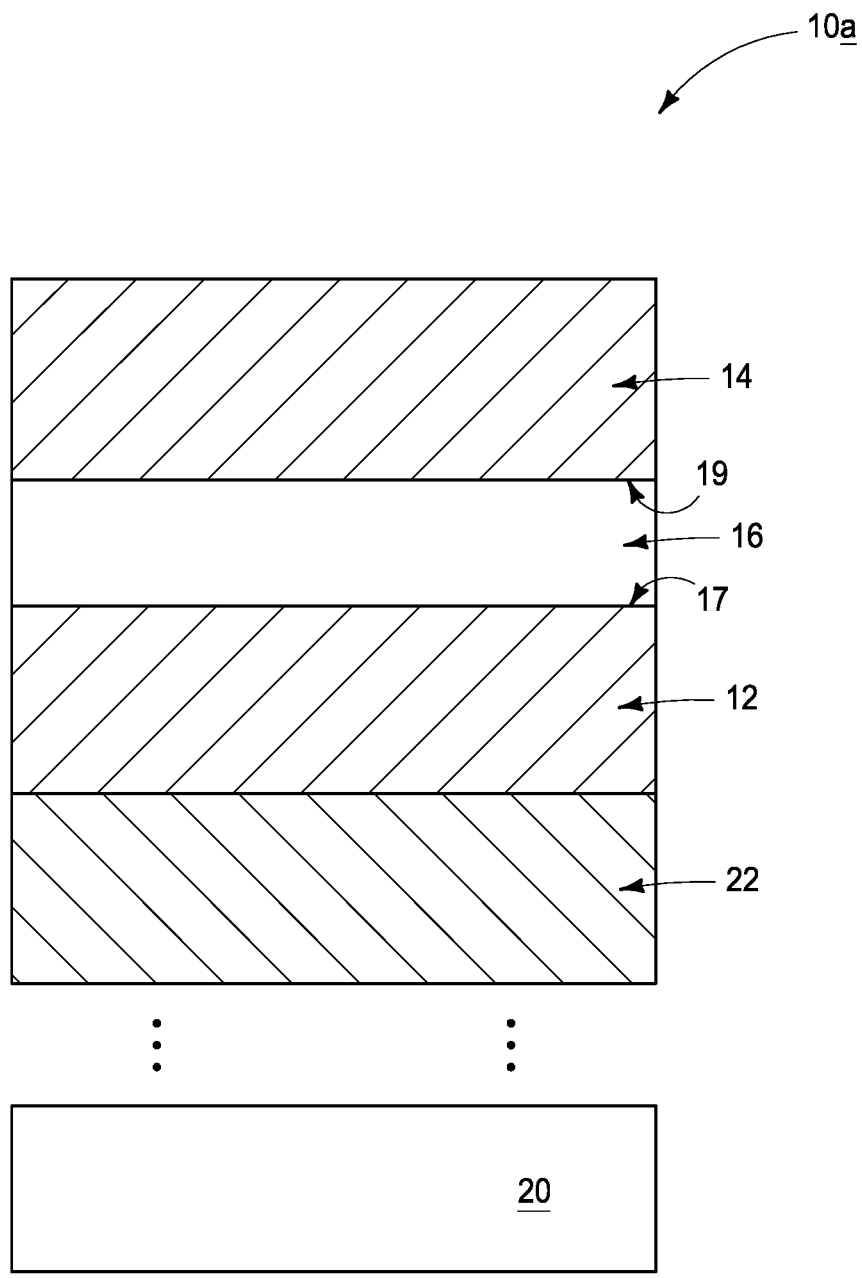

FIG. 2 shows an MTJ device 10a having a tungsten-containing seed material 22, the first magnetic electrode 12 directly against the tungsten-containing seed material 22, the tunnel insulator material 16 over and directly against the first magnetic electrode, and the second magnetic electrode 14 over and directly against the tunnel insulator material 16. The magnetic electrodes 12/14 and tunnel insulator material 16 may comprise the same compositions as described above with reference to the MTJ device 10 of FIG. 1.

The magnetic electrode 12 directly against the tungsten-containing seed material 22 may be either the fixed magnetic electrode or the free magnetic electrode, and in some specific example embodiments may be the free magnetic electrode.

The tungsten-containing seed material may comprise, consist essentially of, or consist of tungsten. In some embodiments, the tungsten-containing seed material may comprise one or both of iridium and ruthenium in addition to tungsten.

The magnetic electrode 12 is formed to have a common crystalline lattice arrangement as the seed material 22 due to the magnetic electrode 12 being formed directly against an upper surface of the seed material 22 and being forced to adopt the lattice arrangement of the seed material. The tungsten-containing seed material may force a strained lattice arrangement into the magnetic electrode 12. For instance, the magnetic electrode 12 may naturally have a first cubic lattice arrangement with a first unit cell, and the seed material 22 may have a second cubic lattice arrangement with a second unit cell, and the second cubic lattice arrangement may be forced upon the magnetic electrode 12. In some embodiments, one of the first and second unit cells may be bcc and the other fcc.

The strained lattice arrangement within the first magnetic electrode 12 may be imparted to the tunnel insulator material 16 and the second electrode 14 due to the tunnel insulator material 16 and second electrode 14 being formed over the first magnetic electrode 12 and forced to adopt the lattice arrangement of the magnetic electrode 12. Thus, in some embodiments the tungsten-containing material 22, first and second magnetic electrodes 12/14, and tunnel insulator material 16 may all comprise a common crystalline lattice arrangement; with such crystalline lattice arrangement being a strained crystalline lattice arrangement in one or more of first magnetic electrode 12, the second magnetic electrode 14, and the tunnel insulator material 16. The strained crystalline lattice arrangement may have compressive strain in some embodiments.

The strained crystalline lattice arrangement may create a magneto-elastic effect along the interfaces 17 and 19, similar to that discussed above with reference to FIG. 1; with the effect being strongest along the interface 17 which is closest to the strain-inducing tungsten-containing material 22, in some embodiments.

In some embodiments, voltage control of the MTJ device 10a may be enhanced by utilizing a piezoelectric composition within the tunnel insulator material 16, similar to the utilization of the piezoelectric composition described above with reference to FIG. 1. The piezoelectric composition may comprise any suitable substances. For instance, in some embodiments the piezoelectric composition may include zirconium and oxygen. In some embodiments, the piezoelectric composition may further include one or more of Ba, Bi, Be, Ca, Mg, Hf, Al, S, Sr, Ti and Cr in addition to the zirconium and oxygen. Inclusion of antiferroelectric materials and/or ferroelectric materials may enhance the magnetoelectric effect.

The MTJ device 10a is supported by the base 20 described above with reference to FIG. 1.

FIGS. 3-6 show some additional example MJT devices 10b-10e. The devices 10b-10e may each be supported by a base 20 of the type described above with reference to FIG. 1, although such base is not shown in FIGS. 3-6.

Figure 3:
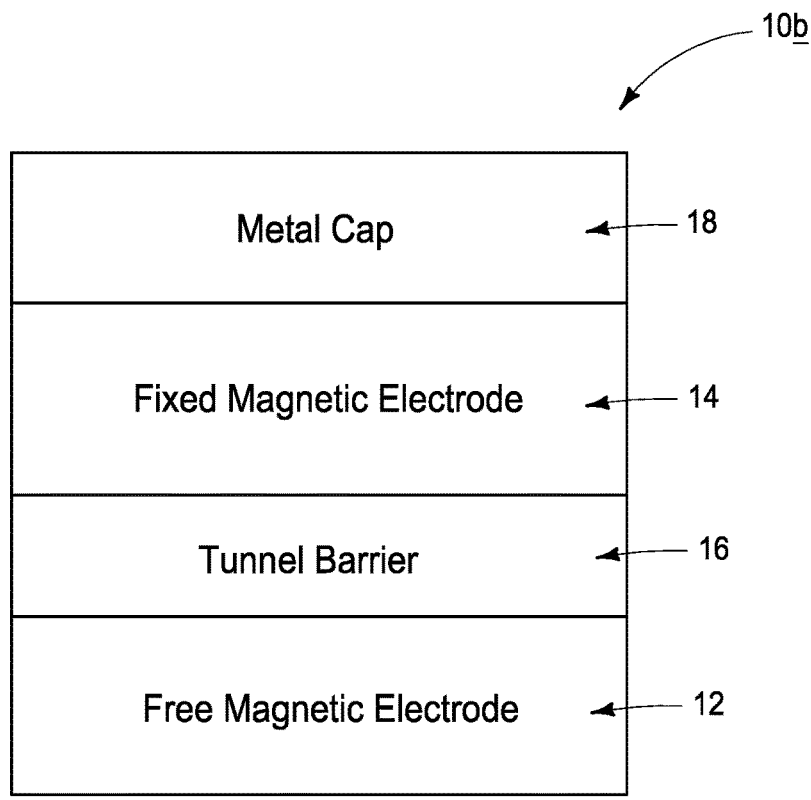
Figure 4:
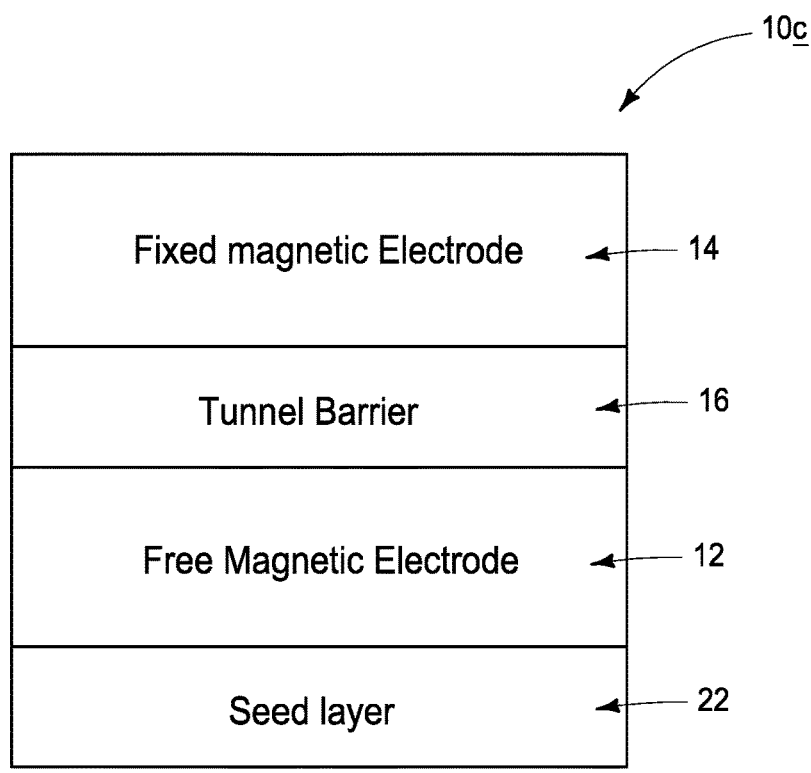

The MTJ devices 10b and 10c of FIGS. 3 and 4 have a stress-engineered W—Ir—Ru material as either a metal cap (FIG. 3) or seed layer (FIG. 4). The W—Ir—Ru material may have any suitable compositional relationship of W, Ir and Ru; and may comprise other components in addition to the W, Ir and Ru. The tunnel barrier of FIGS. 3 and 4 may comprise a conventional composition; such as, for example, MgO. The relative positions of the fixed magnetic electrode 14 and free magnetic electrode 12 may be reversed from the orientation of FIGS. 3 and 4 in some embodiments.

Figure 5:
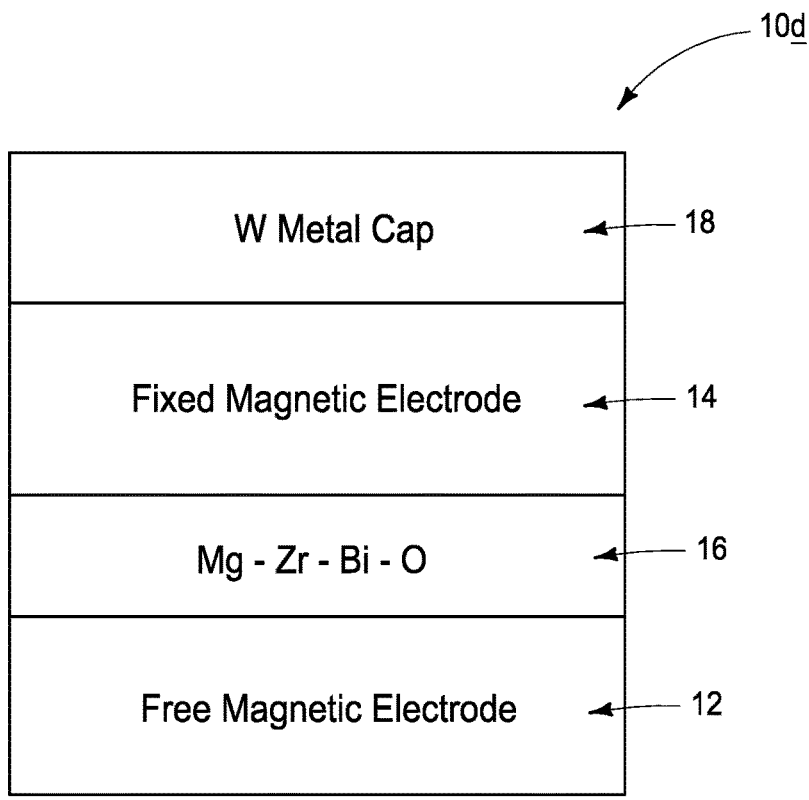
Figure 6:
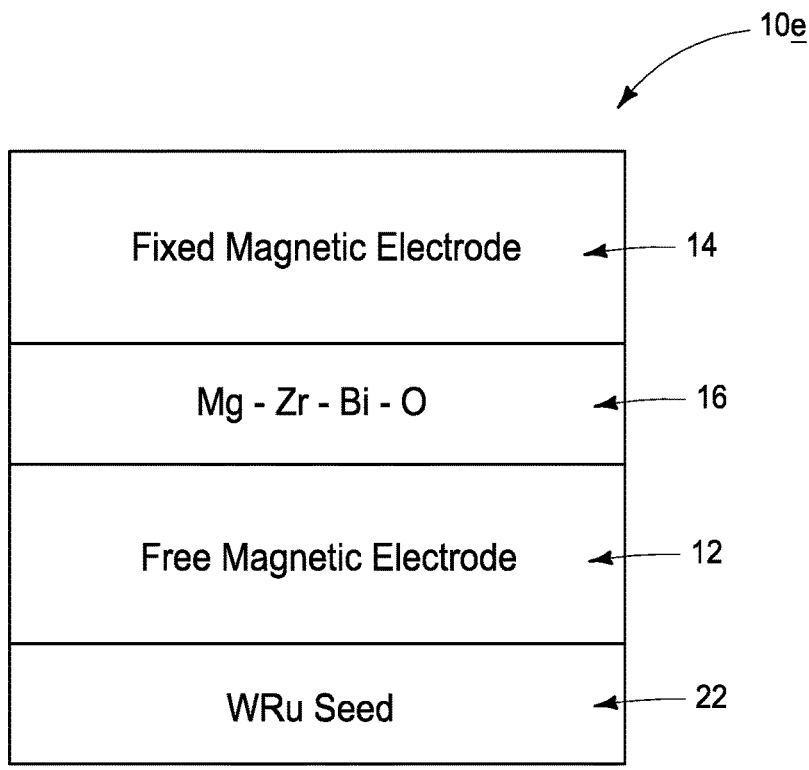

The MTJ devices 10d and 10e of FIGS. 5 and 6 have tunnel barrier material 14 comprising a piezoelectric composition of Mg, Zr, Bi and O. The piezoelectric material may have any suitable compositional relationship of Mg, Zr, Bi and O; and may comprise other components in addition to the Mg, Zr, Bi and O (for instance. one or more of Ba, Bi, Be, Ca, Mg, Hf, Al, S, Sr, Ti and Cr; with inclusion of antiferroelectric materials and/or ferroelectric materials possibly enhancing the magnetoelectric effect). The MTJ devices 10d and 10e of FIGS. 5 and 6 may have stress-engineered W—Ir—Ru material as either a metal cap (FIG. 5) or seed layer (FIG. 6); but such stress-engineered W—Ir—Ru material is optional in the embodiment of FIGS. 5 and 6. The embodiment of FIG. 5 has a tungsten (W)-containing metal cap, but any suitable composition may be utilized for the metal cap in other embodiments. The embodiment of FIG. 6 has a tungsten and ruthenium (WRu)-containing seed material, but any suitable composition may be utilized for the seed material in other embodiments. The relative positions of the fixed magnetic electrode 14 and free magnetic electrode 12 may be reversed from the orientation of FIGS. 5 and 6 in some embodiments.

Although the MTJ devices of FIGS. 1-6 have magnetic electrodes 12/14 directly against the tunnel insulator material 16, in other embodiments there may be additional regions (for instance polarizer regions, buffer regions, etc.) provided between the tunnel insulator material 16 and one or both of the magnetic electrodes 12/14.

The MTJ devices discussed above have applications in perpendicular spin torque logic, magnetoelectric switching devices, AC magnetic field sensors, etc.; and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), plasma-enhances CVD (PECVD), plasma-enhanced ALD (PEALD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

In some embodiments, a magnetic tunnel junction device includes a first magnetic electrode, a second magnetic electrode, and a tunnel insulator material between the first and second magnetic electrodes. A tungsten-containing material is directly against one of the magnetic electrodes. The magnetic tunnel junction device may be a multiferroic device or a magnetoelectric device.

In some embodiments, a magnetic tunnel junction device includes a free magnetic electrode, a fixed magnetic electrode, and a tunnel insulator material between the free and fixed magnetic electrodes. Tungsten-containing material is directly against the fixed magnetic electrode. The tungsten-containing material is in a first crystalline lattice arrangement, and the fixed magnetic electrode is in a second crystalline lattice arrangement different from said first crystalline lattice arrangement.

In some embodiments, a magnetic tunnel junction device includes a free magnetic electrode, a fixed magnetic electrode, and a tunnel insulator material between the free and fixed magnetic electrodes. Tungsten-containing material is directly against the free magnetic electrode. The tungsten-containing material, the free magnetic electrode, the tunnel insulator material and the fixed magnetic electrode all comprise a common crystalline lattice arrangement.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A magnetic tunnel junction device, comprising a stack of layers, the stack consisting of:
a free magnetic electrode, a fixed magnetic electrode, and a tunnel insulator material between the free and fixed magnetic electrodes; and
a tungsten-containing material directly against the free magnetic electrode; wherein the tungsten-containing material, the free magnetic electrode, the tunnel insulator material and the fixed magnetic electrode all comprise a common cubic crystalline lattice arrangement, at least one of the tungsten-containing material, the free magnetic electrode, the tunnel insulator material and the fixed magnetic electrode having a face-centered cubic cell and at least one of the tungsten-containing material, the free magnetic electrode, the tunnel insulator material and the fixed magnetic electrode having a body-centered cubic cell.

2. The magnetic tunnel junction device of claim 1 being a multiferroic device.

3. The magnetic tunnel junction device of claim 1 being a magnetoelectric device.

4. The magnetic tunnel junction device of claim 1 wherein each of the free and fixed magnetic electrodes comprises cobalt and iron.

5. The magnetic tunnel junction device of claim 1 wherein the tunnel insulator material includes zirconium and oxygen, and includes one or more of Ba, Bi, Be, Ca, Mg, Hf, Al, S, Sr, Ti and Cr.

6. The magnetic tunnel junction device of claim 1 wherein the tunnel insulator material is piezoelectric.

7. The magnetic tunnel junction device of claim 6 wherein the tunnel insulator material includes one or both of ferroelectric substances and antiferroelectric substances.

8. The magnetic tunnel junction device of claim 1 wherein the tunnel insulator material is not piezoelectric.

9. The magnetic tunnel junction device of claim 1 wherein the tungsten-containing material includes one or both of Ru and Ir.

10. A magnetic tunnel junction device, comprising a stack of materials consisting of:
a free magnetic electrode comprising Fe and Co, a fixed magnetic electrode comprising Fe and Co, and a tunnel insulator material between the free and fixed magnetic electrodes; and
a tungsten-containing material directly against the free magnetic electrode, the tungsten-containing material further comprising one or both of Ru and Ir; wherein the tungsten-containing material, the free magnetic electrode, the tunnel insulator material and the fixed magnetic electrode all comprise a common cubic crystalline lattice arrangement, at least one of the tungsten-containing material, the free magnetic electrode, the tunnel insulator material and the fixed magnetic electrode having a face-centered cubic cell and at least one of the tungsten-containing material, the free magnetic electrode, the tunnel insulator material and the fixed magnetic electrode having a body-centered cubic cell.

11. The magnetic tunnel junction device of claim 10 being a multiferroic device.

12. The magnetic tunnel junction device of claim 10 being a magnetoelectric device.

13. The magnetic tunnel junction device of claim 10 having increased sensitivity of magnetic anisotropy to an applied electric-field/voltage due to separate or combined magnetoelastic and multiferroic effects.

14. The magnetic tunnel junction device of claim 10 wherein the tunnel insulator material is piezoelectric.

15. The magnetic tunnel junction device of claim 14 wherein the tunnel insulator material includes one or both of ferroelectric substances and antiferroelectric substances.

16. The magnetic tunnel junction device of claim 10 wherein the tunnel insulator material is not piezoelectric.

17. The magnetic tunnel junction device of claim 10 wherein the tunnel insulator material includes zirconium and oxygen, and includes one or more of Ba, Bi, Be, Ca, Mg, Hf, Al, S, Sr, Ti and Cr.

* * * * *